(12) United States Patent
Yu et al.

(10) Patent No.: US 11,810,899 B2
(45) Date of Patent: Nov. 7, 2023

(54) 3DIC FORMATION WITH DIES BONDED TO FORMED RDLS

(71) Applicant: Taiwan Semiconductor Manufacturing Co., Ltd., Hsinchu (TW)

(72) Inventors: Chen-Hua Yu, Hsinchu (TW); Sung-Feng Yeh, Taipei (TW); Ming-Fa Chen, Taichung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 195 days.

(21) Appl. No.: 17/140,547

(22) Filed: Jan. 4, 2021

(65) Prior Publication Data

US 2021/0125968 A1  Apr. 29, 2021

Related U.S. Application Data

(60) Continuation of application No. 16/036,467, filed on Jul. 16, 2018, now Pat. No. 11,004,826, which is a
(Continued)

(51) Int. Cl.
*H01L 21/02* (2006.01)
*H01L 21/288* (2006.01)
(Continued)

(52) U.S. Cl.
CPC ...... *H01L 25/0657* (2013.01); *H01L 21/0214* (2013.01); *H01L 21/0217* (2013.01); *H01L 21/02164* (2013.01); *H01L 21/288* (2013.01); *H01L 21/31051* (2013.01); *H01L 21/3212* (2013.01); *H01L 21/568* (2013.01); *H01L 21/7684* (2013.01); *H01L 21/76885* (2013.01); *H01L 23/295* (2013.01); *H01L 23/3107* (2013.01); *H01L 23/3128* (2013.01); *H01L 23/481* (2013.01); *H01L 24/03* (2013.01); *H01L 24/09* (2013.01); *H01L 24/89* (2013.01); *H01L 25/0652* (2013.01); *H01L 25/50* (2013.01); *H01L 21/561* (2013.01); *H01L 23/49816* (2013.01); *H01L 23/49822* (2013.01); *H01L 23/49827* (2013.01); *H01L 23/5389* (2013.01); *H01L 2224/0231* (2013.01);
(Continued)

(58) Field of Classification Search
CPC ....... H01L 2224/97; H01L 2224/73265; H01L 24/19; H01L 21/568; H01L 24/97; H01L 21/6835
See application file for complete search history.

(56) References Cited

U.S. PATENT DOCUMENTS 8,361,842 B2   1/2013  Yu et al.
8,680,647 B2   3/2014  Yu et al.
(Continued)

*Primary Examiner* — Raj R Gupta
(74) *Attorney, Agent, or Firm* — Slater Matsil, LLP

(57) ABSTRACT

A method includes forming a dielectric layer over a carrier, forming a plurality of bond pads in the dielectric layer, and performing a planarization to level top surfaces of the dielectric layer and the plurality of bond pads with each other. A device die is bonded to the dielectric layer and portions of the plurality of bond pads through hybrid bonding. The device die is encapsulated in an encapsulating material. The carrier is then demounted from the device die and the dielectric layer.

20 Claims, 28 Drawing Sheets

Related U.S. Application Data division of application No. 15/130,460, filed on Apr. 15, 2016, now Pat. No. 10,026,716.

(51) Int. Cl.

| | |
|---|---|
| *H01L 21/3105* | (2006.01) |
| *H01L 21/321* | (2006.01) |
| *H01L 21/56* | (2006.01) |
| *H01L 21/768* | (2006.01) |
| *H01L 25/065* | (2023.01) |
| *H01L 23/31* | (2006.01) |
| *H01L 23/29* | (2006.01) |
| *H01L 23/48* | (2006.01) |
| *H01L 23/00* | (2006.01) |
| *H01L 25/00* | (2006.01) |
| *H01L 23/498* | (2006.01) |
| *H01L 23/538* | (2006.01) |

(52) U.S. Cl.
CPC ............ *H01L 2224/0239* (2013.01); *H01L 2224/02373* (2013.01); *H01L 2224/03002* (2013.01); *H01L 2224/04105* (2013.01); *H01L 2224/05025* (2013.01); *H01L 2224/05124* (2013.01); *H01L 2224/05147* (2013.01); *H01L 2224/08145* (2013.01); *H01L 2224/18* (2013.01); *H01L 2224/80895* (2013.01); *H01L 2224/80896* (2013.01); *H01L 2224/81005* (2013.01); *H01L 2224/82* (2013.01); *H01L 2225/06524* (2013.01); *H01L 2225/06527* (2013.01); *H01L 2225/06541* (2013.01); *H01L 2225/06548* (2013.01); *H01L 2924/01022* (2013.01); *H01L 2924/01029* (2013.01); *H01L 2924/1431* (2013.01); *H01L 2924/1432* (2013.01); *H01L 2924/1433* (2013.01); *H01L 2924/1434* (2013.01); *H01L 2924/1436* (2013.01); *H01L 2924/1437* (2013.01); *H01L 2924/1461* (2013.01); *H01L 2924/15311* (2013.01); *H01L 2924/15331* (2013.01); *H01L 2924/2011* (2013.01); *H01L 2924/20106* (2013.01); *H01L 2924/20107* (2013.01); *H01L 2924/20108* (2013.01); *H01L 2924/20109* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 2009/0188701 A1 | 7/2009 | Tsuzuki et al. |
| 2010/0148360 A1 | 6/2010 | Lin et al. |
| 2011/0068468 A1* | 3/2011 | Lin ............... H01L 25/0652 257/737 |
| 2011/0129986 A1 | 6/2011 | Libralesso et al. |
| 2011/0291288 A1 | 12/2011 | Wu et al. |
| 2012/0129301 A1 | 5/2012 | Or-Bach et al. |
| 2012/0168935 A1 | 7/2012 | Huang |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0319601 A1 | 10/2014 | Ho et al. |
| 2015/0021785 A1 | 1/2015 | Lin |
| 2015/0318262 A1* | 11/2015 | Gu ............... H01L 23/145 257/737 |

\* cited by examiner

3DIC FORMATION WITH DIES BONDED TO FORMED RDLS

PRIORITY

This application claims the benefit to and is a continuation of U.S. patent application Ser. No. 16/036,467, filed on Jul. 16, 2018, and entitled "3DIC Formation with Dies Bonded to Formed RDLs;" which claims the benefit to and is a divisional of U.S. patent application Ser. No. 15/130,460, filed on Apr. 15, 2016 (now U.S. Pat. No. 10,026,716, issued Jul. 17, 2018), and entitled "3DIC Formation with Dies Bonded to Formed RDLs;" which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

In conventional packaging methods, a Package-on-Package (PoP) structure may be formed. The PoP structure includes a bottom package, and a top package bonded to the bottom package. To form the bottom package, a device die is first molded in a molding compound, with the metal bumps of the device die exposed through the molding compound. Redistribution Lines (RDLs) that are used for rerouting electrical signal to a greater area than the device die are then formed on the molding compound and the device die. The formation of the RDLs may involve a high thermal budget, which has an adverse effect on the device die.

Another packaging method is known as Chip-on-Wafer-on-Substrate (CoWoS). In the respective packaging, a first plurality of device dies are first bonded to a wafer, which includes a second plurality of device dies therein. The bonding may be through micro bump or solder regions. An underfill is then dispensed into the gaps between the first plurality of device dies and the second plurality of device dies. The wafer is then singulated into a plurality of packages. Each of the packages is bonded to a package substrate, for example, through solder regions. Another underfill is then dispensed between the package and the package substrate that are bonded together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
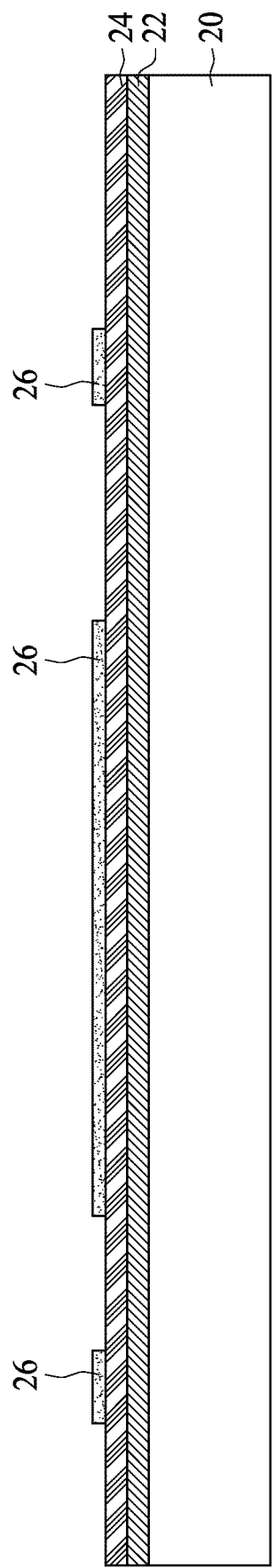
FIGS. 1 through 17 are cross-sectional views of intermediate stages in the manufacturing of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated fan-out package is provided in accordance with various exemplary embodiments. The variations of some embodiments are discussed. Throughout the various views and illustrative embodiments, like reference numbers are used to designate like elements.

Figure 28:
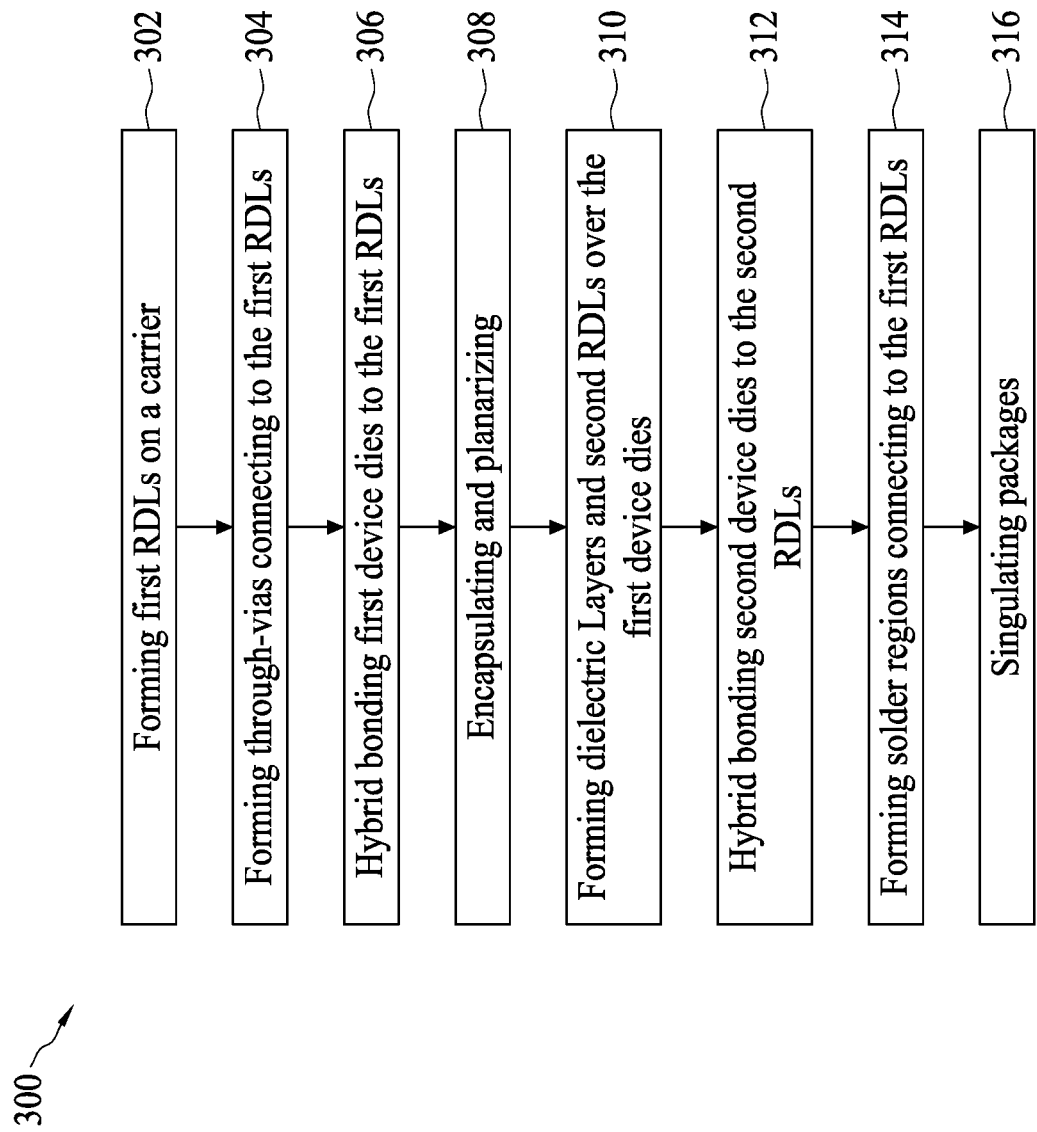
FIG. 28 illustrates a process flow for forming a package in accordance with some embodiments.

FIGS. 1 through 17 illustrate the cross-sectional views of intermediate stages in the manufacturing of a package in accordance with embodiments. The steps shown in FIG. 1 through 17 are also illustrated schematically in the process flow 300 in FIG. 28. In the subsequent discussion, the process steps shown in FIGS. 1 through 17 are discussed referring to the process steps in FIG. 28.

FIGS. 1 through 5 illustrate the steps for forming first Redistribution Lines (RDLs). The respective step is shown as step 302 in the process flow shown in FIG. 28. FIG. 1 illustrates carrier 20 and release layer 22 formed on carrier 20. Carrier 20 may be a glass carrier, a ceramic carrier, or the like. Carrier 20 may have a round top-view shape and may have a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. In accordance with some embodiments, release layer 22 is formed of an ultra-violet (UV) glue. Release layer 22 may be dispensed as a liquid and cured. In accordance with alternative embodiments, release layer 22 is a laminate film and is laminated onto carrier 20. The top surface of release layer 22 is leveled and has a high degree of co-planarity.

Dielectric layer 24 is formed over release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be easily patterned using a photo lithography process. In accordance with alternative embodiments, dielectric layer 24 is formed of a nitride such as silicon nitride, an oxide such as silicon oxide, PhosphoSilicate Glass (PSG), Boro-Silicate Glass (BSG), Boron-doped PhosphoSilicate Glass (BPSG), or the like.

Figure 8:
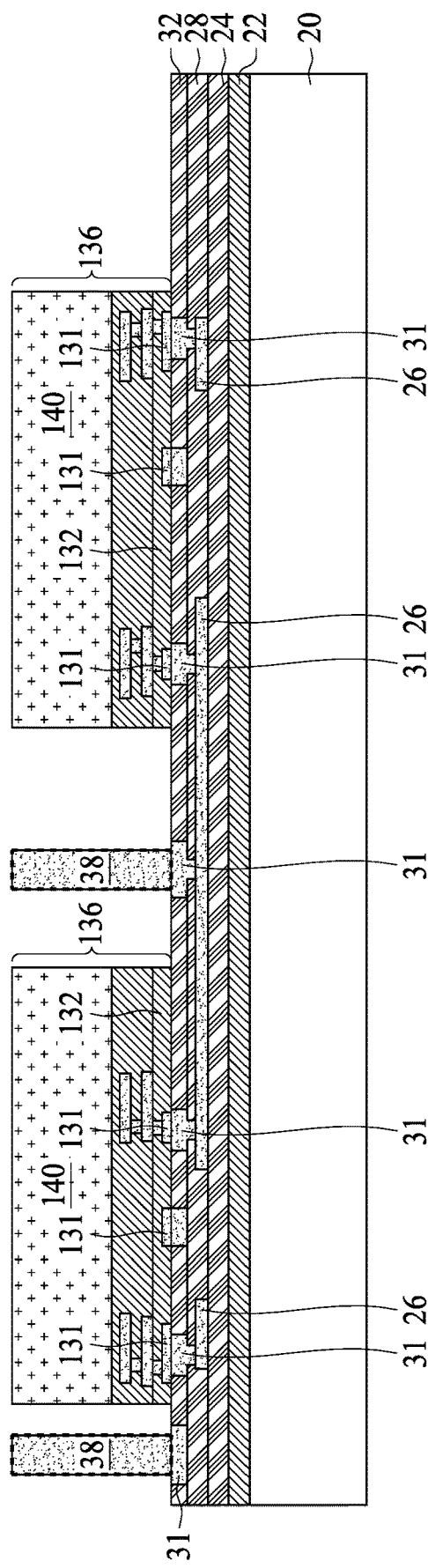

Redistribution Lines (RDLs) 26 are formed over dielectric layer 24. RDLs 26 are also referred to as front-side RDLs since they are located on the front side of device die 136 (FIG. 8). The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 2. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Figure 2:
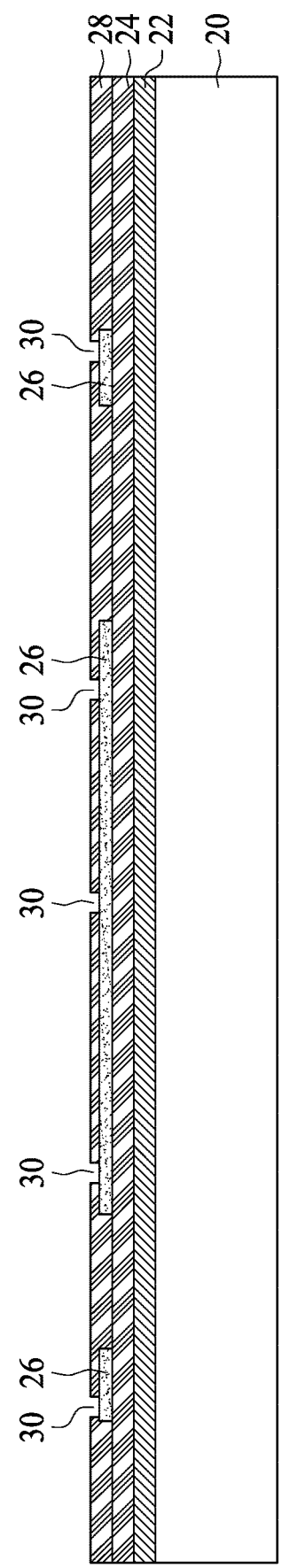

Referring to FIG. 2, dielectric layer 28 is formed on RDLs 26. The bottom surface of dielectric layer 28 may be in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. In accordance with alternative embodiments, dielectric layer 28 is formed of a nitride such as silicon nitride, an oxide such as silicon oxide, PSG, BSG, BPSG, or the like. Dielectric layer 28 is then patterned to form openings 30 therein. Hence, some portions of RDLs 26 are exposed through the openings 30 in dielectric layer 28.

Figure 3:
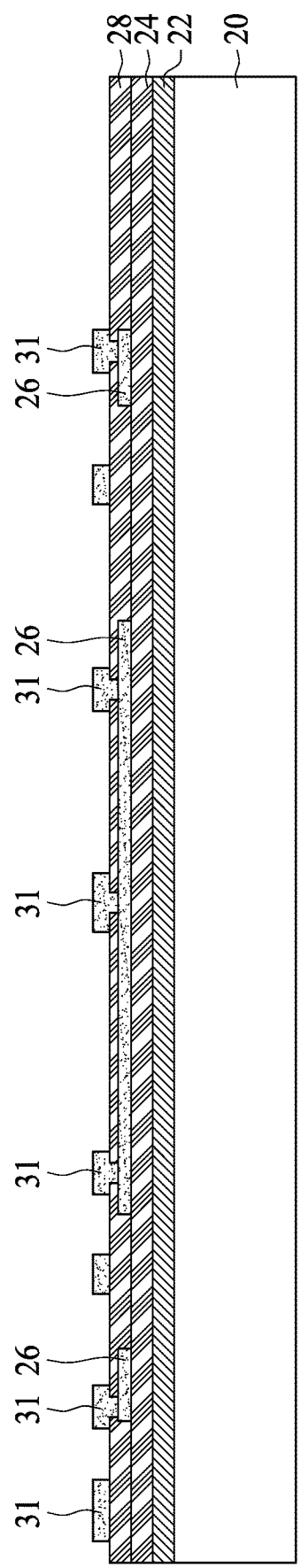

FIG. 3 illustrates the formation of RDLs 31, which include bond pads therein. RDLs 31 includes portions extending into openings 30 (FIG. 2) to contact RDLs 26. In accordance with some embodiments, RDLs 31 include copper. The formation process of RDLs 31 may be similar to the formation of RDLs 26, which includes forming a seed layer, forming and patterning a mask, plating RDLs 31, removing the mask, and etching the exposed portions of the seed layer.

Figure 4:
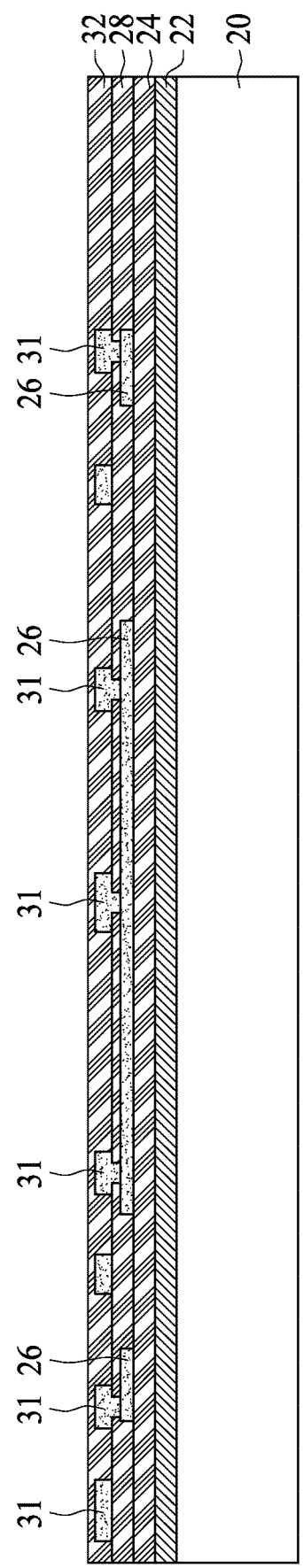

Next, as shown in FIG. 4, dielectric layer 32 is formed to cover RDLs 31. The top surface of dielectric layer 32 is higher than RDLs 31. In accordance with some embodiments, dielectric layer 32 is formed of a polymer (an organic material), which may be polyimide, PBO, or the like.

Figure 5:
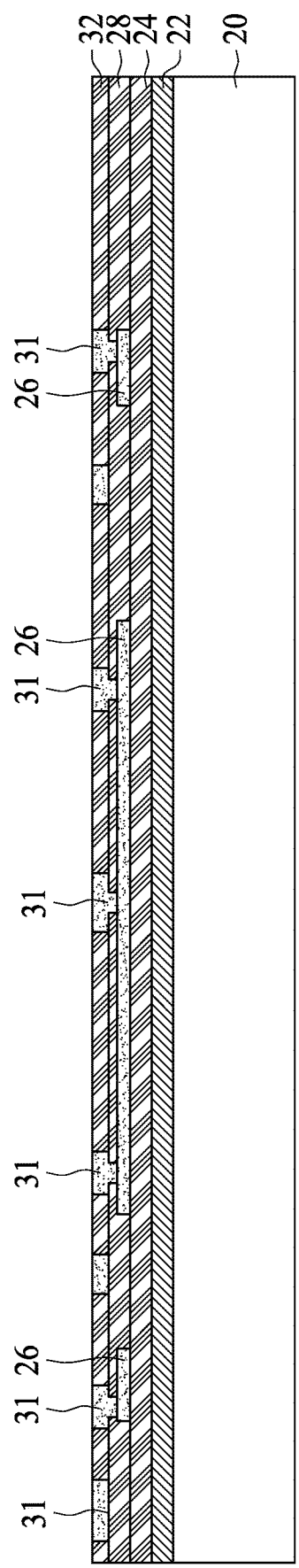

FIG. 5 illustrates the planarization to level the top surfaces of dielectric layer 32 and RDLs 31, so that the top surfaces of dielectric layer 32 and RDLs 31 are coplanar with each other. The planarization may be performed through grinding or Chemical Mechanical Polish (CMP). To ensure the top surfaces of RDLs 31 are coplanar, in the plating of RDLs 31, the thickness of RDLs 31 is increased to ensure that after the planarization, the thickness of RDLs 31 is adequate, and no dishing exists.

In accordance with alternative embodiments, RDLs 31 and dielectric layers 28 and 32 are formed in a dual damascene process, which includes depositing dielectric layers 28 and 32 (which may be formed as a single layer or two layers separated by an etch stop layer), forming trenches in dielectric layer 32 and via openings in dielectric layer 28 to expose some portions of RDLs 26, and filling the trenches and via openings with a conductive material. A CMP is then performed to remove excess conductive material. Accordingly, the portions of the conductive material filling the trenches in dielectric layer 32 become the bond pads and metal traces, while the portions of the conductive material filling the via openings in dielectric layer 28 become vias. In accordance with some embodiments, the conductive material includes a diffusion barrier layer and a filling metal over the vias barrier layer. The barrier layer may be formed of titanium, titanium nitride, tantalum, or tantalum nitride. The filling metal may be formed of copper or a copper-containing alloy. Dielectric layer 32 and 28 may be formed of an inorganic dielectric material, which may be oxide-containing and/or silicon-containing. In accordance with some embodiments of the present disclosure, dielectric layer 32 and 28 are formed of silicon oxide, silicon oxynitride, or the like.

Figure 6:
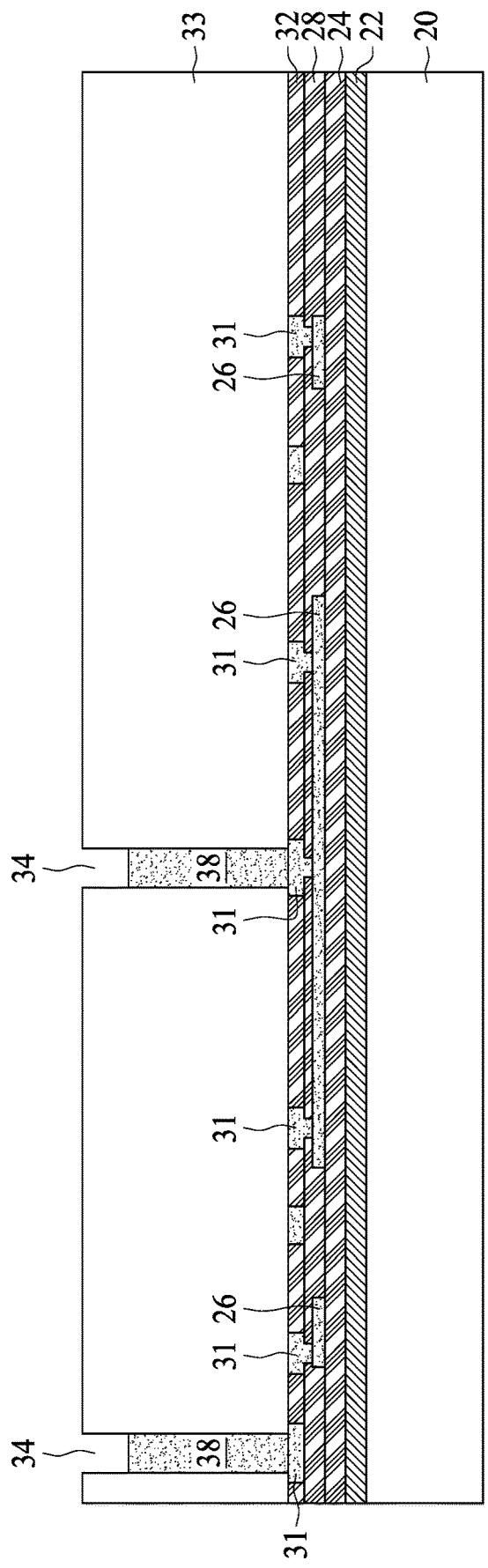

FIG. 6 illustrates the formation of through-vias 38 in accordance with some embodiments. The respective step is shown as step 304 in the process flow shown in FIG. 28. Referring to FIG. 6, photo resist 33 is applied and patterned to form openings 34, through which some portions of RDLs 31 are exposed. In accordance with some embodiments, no seed layer is formed, and the subsequent formed through-vias 38 are plated directly from RDLs 31.

Figure 7:
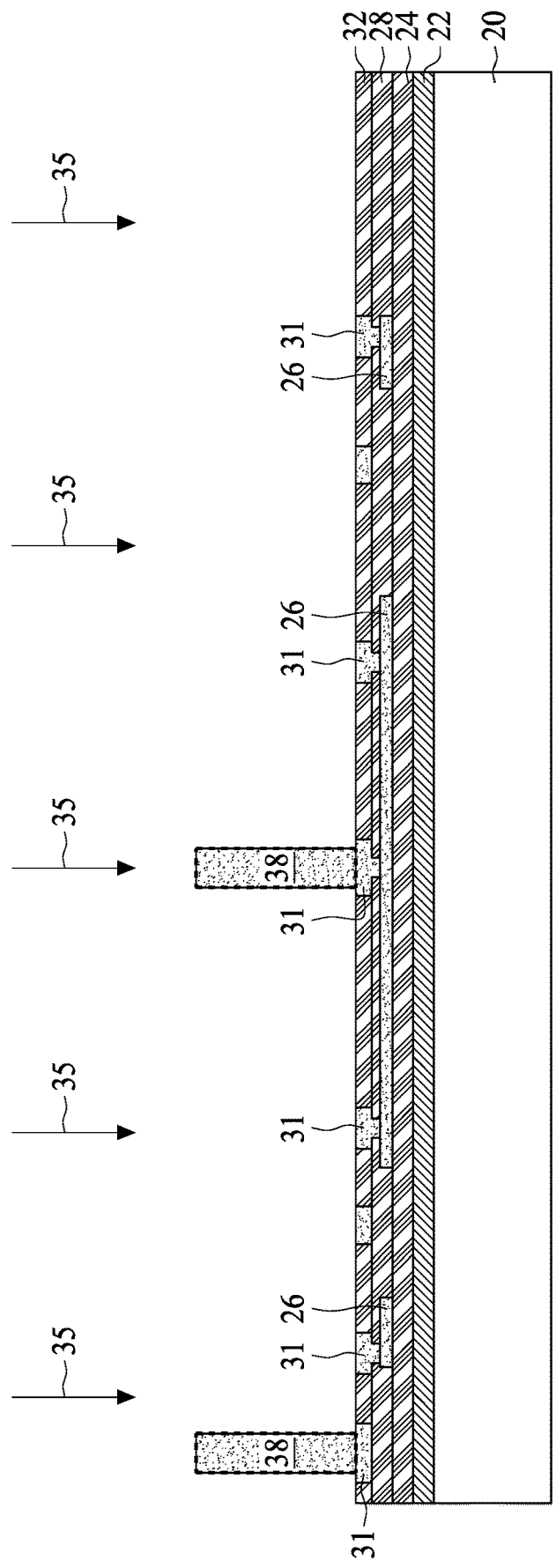

Next, metal posts 38 are formed by plating. Throughout the description, metal posts 38 are alternatively referred to as through-vias 38 since in the final structure, metal posts 38 penetrate through the subsequently formed encapsulating material. In accordance with some embodiments of the present disclosure, through-vias 38 are formed by plating. Through-vias 38 are used for electrically inter-coupling features on the opposite ends of through-vias 38. The material of through-vias 38 may include copper, aluminum, tungsten, or the like. Through-vias 38 have the shape of rods. The top-view shapes of through-vias 38 may be circles, rectangles, squares, hexagons, or the like. In accordance with some embodiments of the present disclosure, through-vias 38 are arranged to align to a ring (in the top view of the structure in FIG. 6) encircling a region therein, wherein the region is used for placing device die(s) 136 (FIG. 8). After the plating, photo resist 33 is removed, and the resulting structure is shown in FIG. 7. In accordance with alternative embodiments, no through-vias 38 are formed. Accordingly, through-vias 38 are illustrated using dashed lines to indicate they may or may not be formed.

FIG. 7 also illustrates the treatment of bond pads 31 and dielectric layer 32, as symbolized by arrows 35. In accordance with some embodiments, the treatment comprises a plasma treatment using process gases comprising nitrogen ($N_2$) or a combined gas of $N_2$ and $H_2$. The pressure of the process gases may be in the range between about 10 mTorr and about 50 mTorr. The power for generating the plasma may be in the range between about 100 Watts and about 300 Watts. The bias voltage may be in the range between about 250V and about 400V. The treatment time may be in the range between about 30 seconds and about 20 minutes. Through the treatment, the treated surface, particularly the surface of dielectric layer 32 (which may be formed of a polymer or an oxide) is activated for the subsequent bonding. If the treatment is not performed, the quality of the bonding may not be good enough for production.

FIG. 8 illustrates the bonding of device die(s) 136 to the underlying dielectric layer 32 and bond pads 31 (which are portions of RDLs 31). The respective step is shown as step 306 in the process flow shown in FIG. 28. In accordance with some exemplary embodiments, device dies 136 are Central Processing Units (CPU), Application processors (APs), or other types of logic dies including logic transistors therein. Although two device dies 136 are illustrated, fewer or more device dies may be bonded. Device dies 136 may have an identical structure, or may have different structures and functions.

Device dies 136 include bond pads 131, which may comprise copper, aluminum, or alloys thereof. Surface dielectric layer 132 has a surface coplanar with the respective surfaces of bond pads 131. In accordance with some embodiments, surface dielectric layer 132 is formed of an inorganic dielectric material (which may be an oxide) such as silicon oxide or silicon oxynitride, or a polymer (organic material) such as polyimide, PBO, or the like. Before the bonding, the bonding surfaces of bond pads 131 and dielectric layer 132 are also treated using essentially the same process for treating dielectric layer 32 and bond pads 31, as shown in FIG. 7.

Device dies 136 are bonded to dielectric layer 32 and bond pads 31 through hybrid bonding. To achieve the hybrid bonding, device dies 136 are first pre-bonded to dielectric layer 32 and bond pads 31 by lightly pressing device dies 136 against dielectric layer 32 and bond pads 31. Although two device dies 136 are illustrated, the hybrid bonding may be performed at wafer level, wherein a plurality of device dies identical to the illustrated device dies 136 are pre-bonded, and arranged as rows and columns.

After all device dies 136 are pre-bonded, an annealing is performed to cause the inter-diffusion of the metals in bond pads 131 and 31. In accordance with some embodiments of the present disclosure, one or both of dielectric layers 32 and 132 comprise a polymer. Accordingly, the annealing temperature is lowered to lower than about 250° C. in order to avoid the damage of the polymer. For example, the annealing temperature (with the presence of polymer) may be in the range between about 200° and about 250° C. The annealing time may be between about 2 hours and 3 hours. When both dielectric layers 32 and 132 are formed of inorganic dielectric materials such as oxide or oxynitride, the annealing temperature may be higher, which is lower than about 400° C. For example, the annealing temperature (without the presence of polymer) may be in the range between about 300° and about 400° C., and the annealing time may be in the range between about 1.5 hours and about 2.5 hours.

Through the hybrid bonding, bond pads 131 and 31 are bonded to each other through direct metal bonding caused by metal inter-diffusion. Bond pads 131 and 31 may have distinguishable interfaces. Dielectric layer 32 is also bonded to dielectric layer 132, with bonds formed therebetween. For example, the atoms (such as oxygen atoms) in one of the dielectric layers 32 and 132 form chemical or covalence bonds (such as O—H bonds) with the atoms (such as hydrogen atoms) in the other one of dielectric layers 32 and 132. The resulting bonds between dielectric layers 32 and 132 are dielectric-to-dielectric bonds, which may be inorganic-to-polymer, polymer-to-polymer, or inorganic-to-inorganic bonds in accordance with various embodiments. Furthermore, the surface dielectric layers 132 of two device dies 136 may be different from each other (for example, with one being a polymer layer and the other being an inorganic layer), and hence there may be two types of inorganic-to-polymer, polymer-to-polymer, and inorganic-to-inorganic bonds existing simultaneously in the same package.

As also shown in FIG. 8, bond pads 131 may have sizes greater than, equal to, or smaller than, the sizes of the respective bond pads 31. FIG. 8 illustrates the three scenarios as examples.

Next, encapsulating material 44 is encapsulated on device dies 136 and through-vias 38. The respective step is shown as step 308 in the process flow shown in FIG. 28. Encapsulating material 44 fills the gaps between neighboring through-vias 38 and the gaps between through-vias 38 and device dies 136. The top surface of encapsulating material 44 is higher than the top ends of through-vias 38. In accordance with some embodiments, encapsulating material 44 includes a molding compound, a molding underfill, an epoxy, and/or a resin, with filler particles (such as $Al_2O_3$ particles) therein. Encapsulating material 44 is then cured. In accordance with alternative embodiments, encapsulating material 44 is formed of an inorganic dielectric material including an oxide (such as silicon oxide or silicon oxynitride) or a nitride (such as silicon nitride). The formation methods of encapsulating material 44 in accordance with these embodiments may include Chemical Vapor Deposition (CVD).

Figure 9:
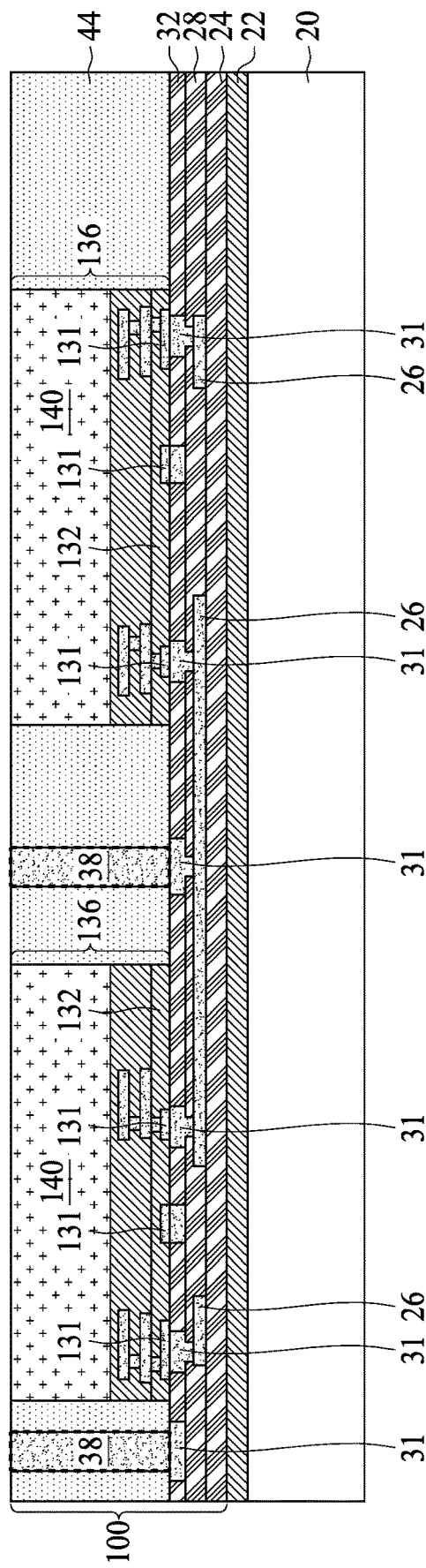

In a subsequent step, a planarization such as a CMP step or a grinding step is performed to thin encapsulating material 44 until through-vias 38 (if any) are exposed. The respective step is also shown as step 308 in the process flow shown in FIG. 28. The resulting structure is shown in FIG. 9. Due to the grinding, the top ends of through-vias 38 are substantially level (coplanar) with the top surface of encapsulating material 44 and the back surfaces of device dies 136, wherein the back surfaces of device dies 136 may be the back surfaces of semiconductor substrates 140 of device dies 136. After the planarization, carrier 20 may be de-mounted. Throughout the description, the structure over release layer 22 is referred to as package 100, which may be a composite wafer in accordance with some embodiments.

Figure 10:
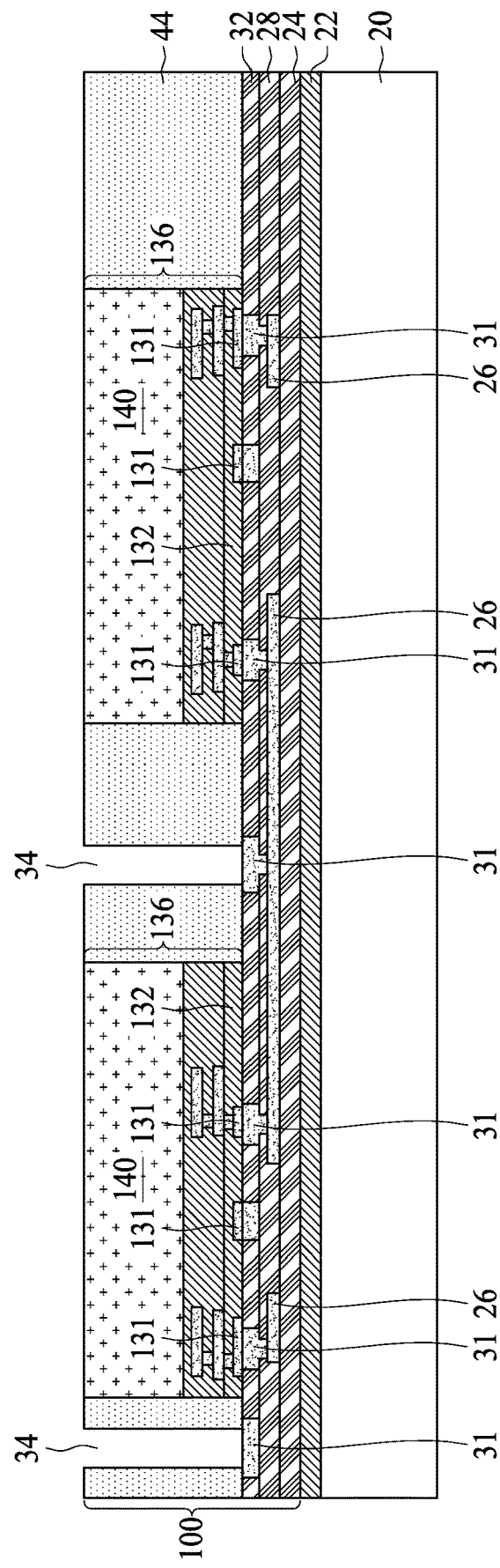

FIG. 10 illustrates the formation of through-vias 38 in accordance with some embodiment. In the embodiments wherein through-vias 38 are not formed in preceding steps (FIG. 6), openings 34 may be formed in encapsulating material 44 to expose RDLs 31. The formation of openings 34 may be achieved through laser drilling (for example, when encapsulating material 44 is formed of a molding compound) or etching (for example, when encapsulating material 44 is formed of an inorganic dielectric material). In a subsequent step, a plating step is performed to form through-vias 38 in openings 34 until the top surfaces of through-vias 38 are substantially level with, slightly higher than, or slightly lower than the top surface of encapsulating material 44. A planarization may (or may not) be performed to level to the top surfaces of encapsulating material 44 and through-vias 38. The resulting structure is similar to what is shown in FIG. 9, except the top surfaces of through-vias 38 may be substantially level with, slightly higher than, or slightly lower than the top surface of encapsulating material 44.

Figure 11:
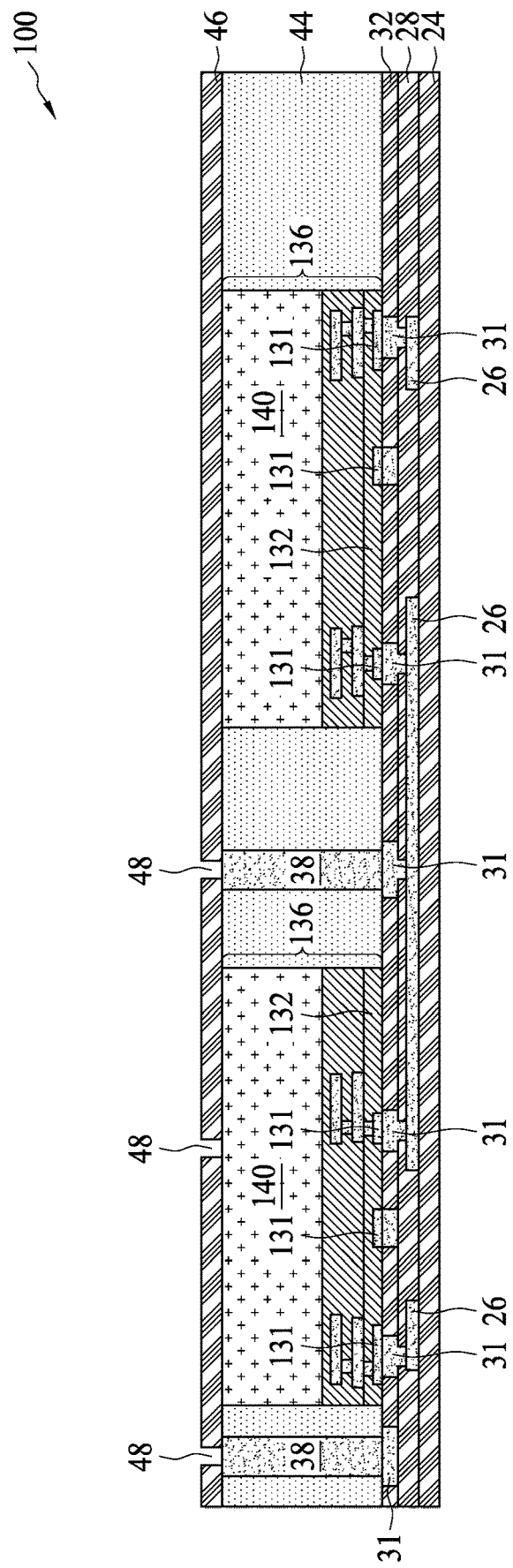

FIGS. 11 through 15 illustrate the formation of backside RDLs and the respective dielectric layers. The respective step is shown as step 310 in the process flow shown in FIG. 28. Referring to FIG. 11, dielectric layer 46 is formed. In accordance with some embodiments of the present disclosure, dielectric layer 46 is formed of a polymer such as PBO, polyimide, or the like. In accordance with alternative embodiments, dielectric layer 46 is formed of silicon nitride, silicon oxide, or the like. Openings 48 are formed in dielectric layer 46 to expose through-vias 38. The formation of openings 48 may be performed through a photo lithography process.

Figure 12:
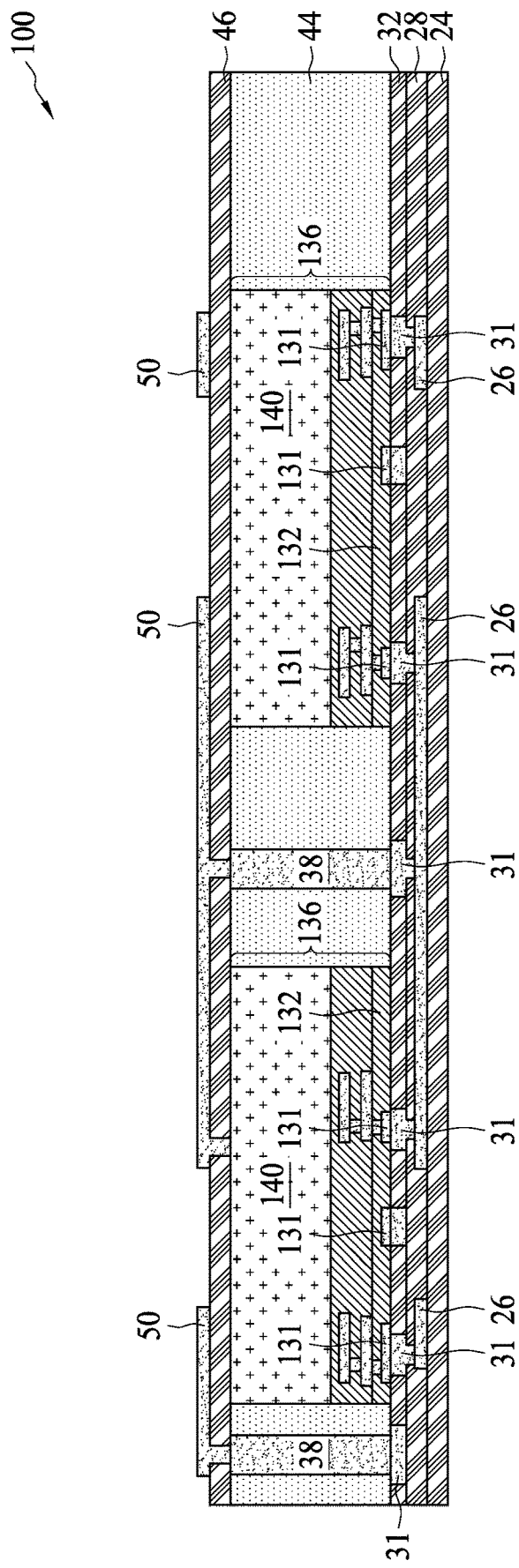

Next, referring to FIG. 12, RDLs 50 are formed to connect to through-vias 38. RDLs 50 may also interconnect through-vias 38. RDLs 50 include metal traces (metal lines) over dielectric layer 46 and vias extending into dielectric layer 46. The vias in RDLs 50 are connected to Through-vias 38. In accordance with some embodiments of the present disclosure, RDLs 50 are formed in a plating process, wherein each of RDLs 50 includes a seed layer (not shown) and a plated metallic material over the seed layer. The seed layer and the plated material may be formed of the same material or different materials.

Figure 13:
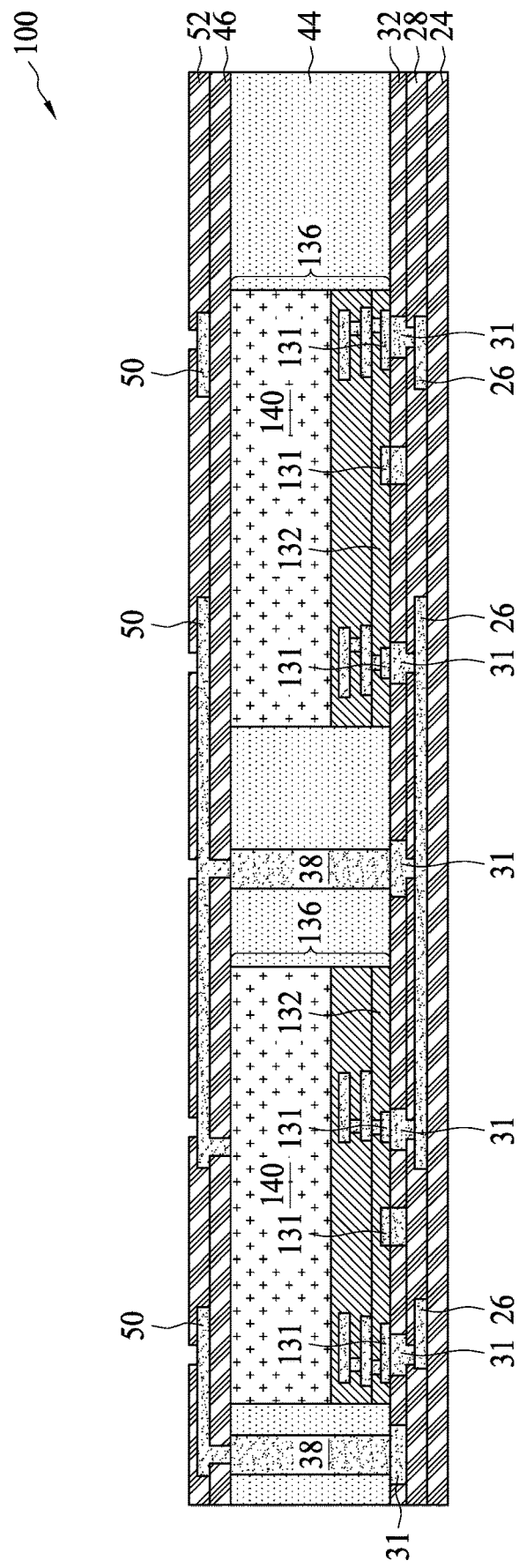
Figure 14:
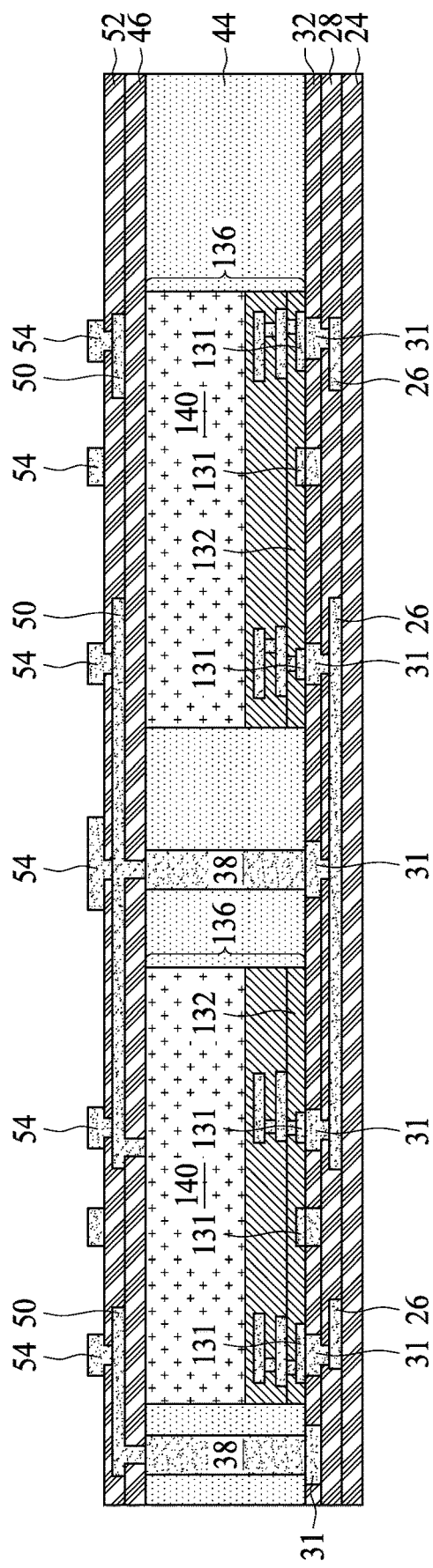

Referring to FIG. 13, in accordance with various embodiments, dielectric layer 52 is formed over the structure shown in FIG. 12, followed by the formation of RDLs 54 in dielectric layer 52, as shown in FIG. 14. In accordance with some embodiments of the present disclosure, the formation of RDLs 54 includes forming a blanket copper seed layer, forming and patterning a mask layer over the blanket copper seed layer, performing a plating to form RDLs 54, removing the mask layer, and performing an etching step to remove the portions of the blanket copper seed layer not covered by RDLs 54. RDLs 54 may be formed of a metal or a metal alloy including aluminum, copper, tungsten, and/or alloys thereof.

Figure 15:
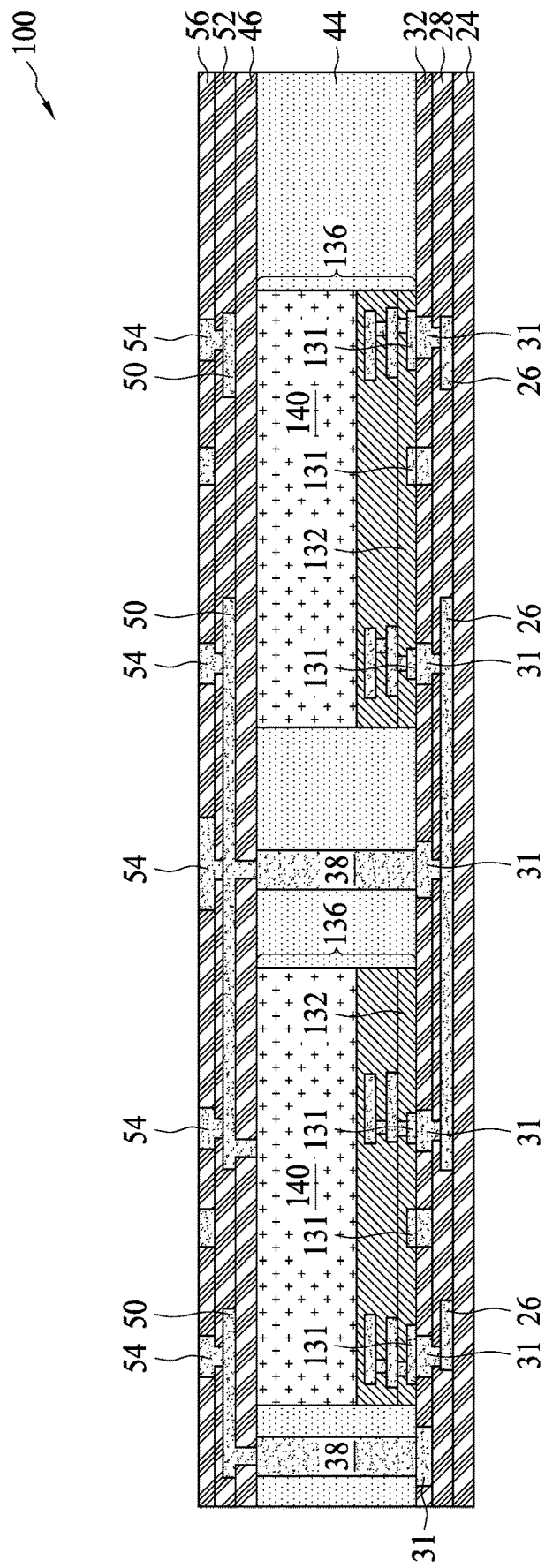

FIG. 15 illustrates the formation of dielectric layer 56 in accordance with some exemplary embodiments. Dielectric layer 56 may be formed of a material selected from the same candidate materials for forming dielectric layer 32. Furthermore, the formation methods of dielectric layer 56 and RDLs 54 may also be similar to the formation methods of dielectric layer 32 and RDLs 31, respectively.

Figure 16:
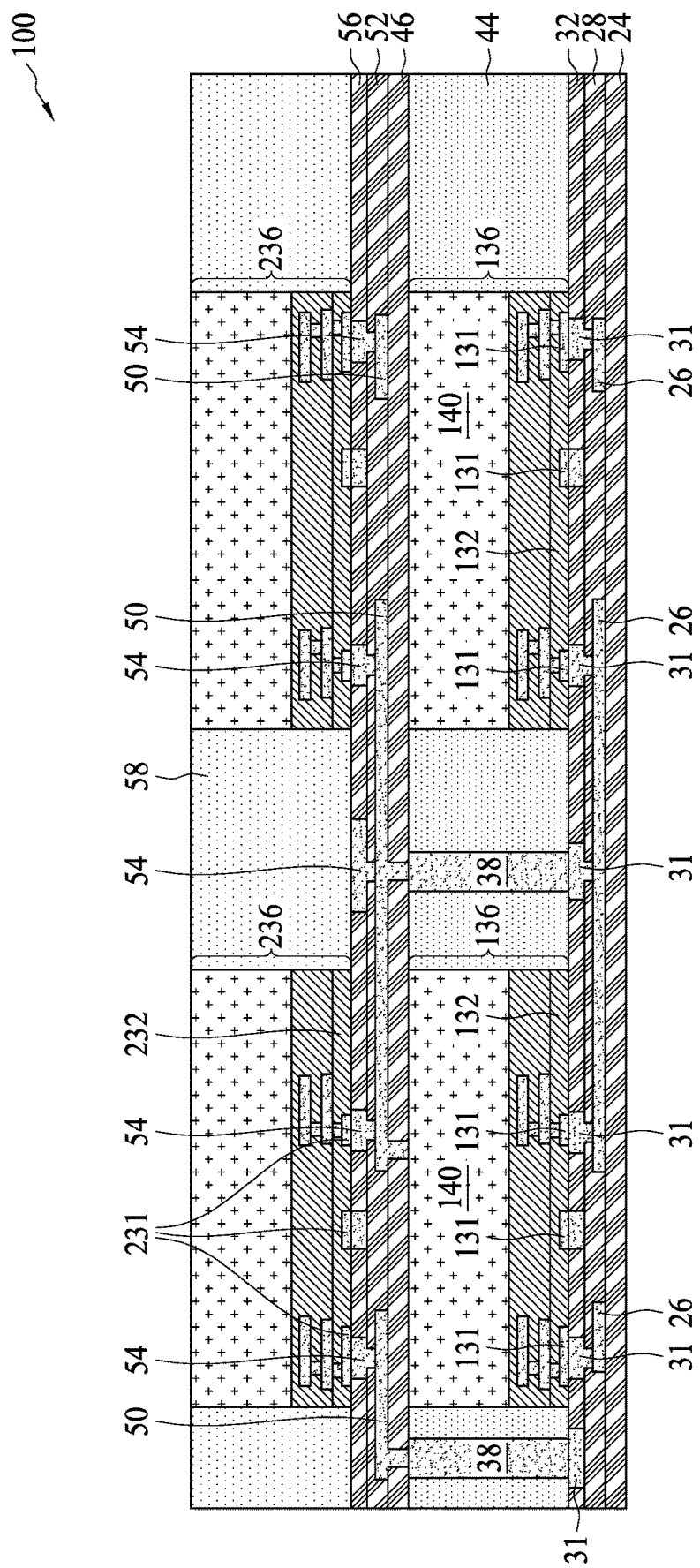

In a subsequent step, as shown in FIG. 16, device dies 236 are bonded to dielectric layer 56 and bond pads 54 (which are parts of RDLs 54) through hybrid bonding. The respective step is shown as step 312 in the process flow shown in FIG. 28. The details of the bonding may be essentially the same as the bonding of device dies 136, and hence are not repeated herein. In accordance with some embodiments of the present disclosure, device dies 236 are memory dies or logic device dies. For example, device dies 236 may be Dynamic Random Access Memory (DRAM) dies, Static Random Access Memory (SRAM) dies, High-Bandwidth Memory (HBM) dies, Micro-Electro-Mechanical System (MEMS) dies, Hybrid Memory Cube (HMC) dies, or the like. Next, encapsulating material 58 is encapsulated on device dies 236. A planarization step may then be performed.

Figure 17:
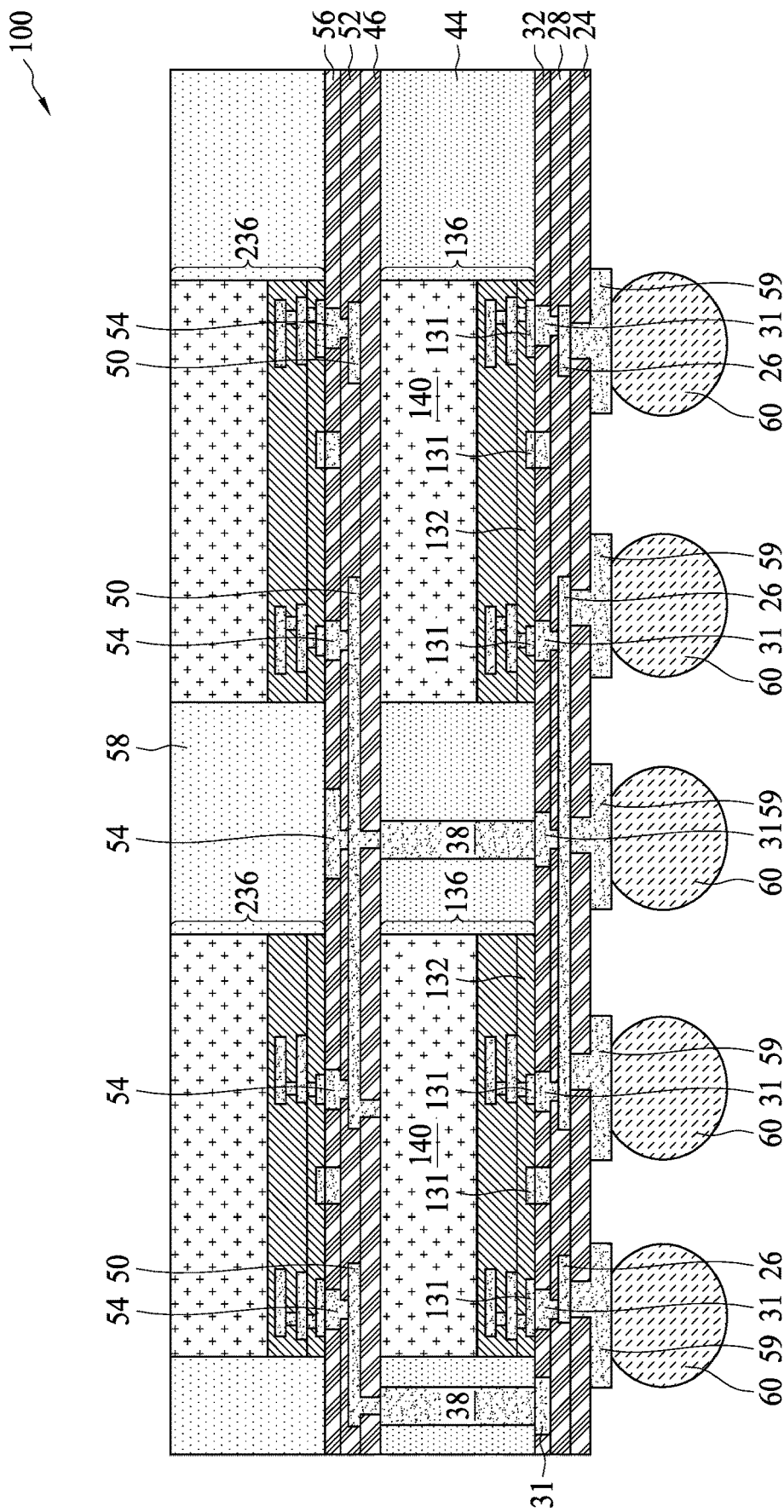

FIG. 17 illustrates the formation of conductive features such as Under-Bump-Metallurgies (UBMs) 59 and solder regions 60. The respective step is shown as step 314 in the process flow shown in FIG. 28. First, openings (occupied by UBMs 59) are formed in dielectric layer 24. The formation of openings may be achieved through laser burning. Alternatively, when dielectric layer 24 is formed of a light-sensitive material such as PBO or polyimide, the formation of the openings may also be achieved through photo lithography. UBMs 59 may be formed using a similar process for forming RDLs 26. Solder regions 60 are then attached/formed on UBMs 59. Package 100 may then be singulated into a plurality of packages, each including one or more device dies 136. The respective step is shown as step 316 in the process flow shown in FIG. 28.

FIGS. 18 through 23 illustrate the cross-sectional views of intermediate stages in the formation of a package in accordance with some embodiments of the present disclosure. These embodiments are similar to the embodiments shown in FIGS. 1 through 17, except that instead of forming RDLs from a carrier, the RDLs are formed from a device wafer. Unless specified otherwise, the materials and the formation methods of the components in these embodiments are essentially the same as the like components, which are denoted by like reference numerals in the embodiments shown in FIGS. 1 through 17. The details regarding the formation process and the materials of the components shown in FIGS. 18 through 23 (and FIGS. 24 through 27) may thus be found in the discussion of the embodiments shown in FIGS. 1 through 17.

Figure 18:
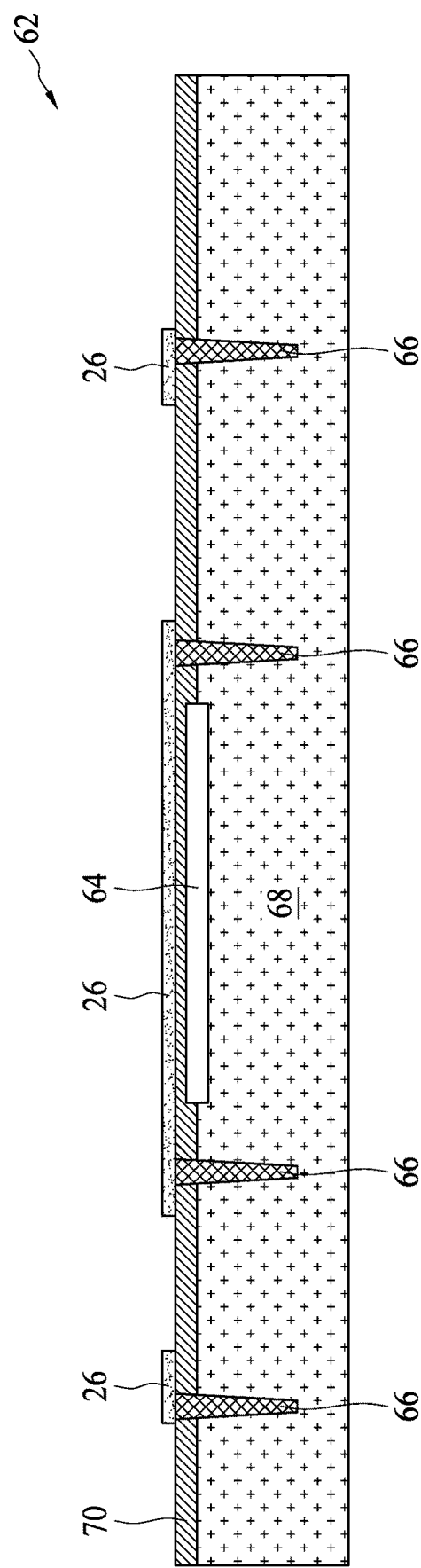
FIGS. 18 through 23 are cross-sectional views of intermediate stages in the manufacturing of a package in accordance with some embodiments.

Referring to FIG. 18, device die/wafer 62 is provided, with the illustrated portion being a device die part in the wafer. In accordance with some embodiments, device die 62 is a CPU die, an AP die or another type of logic die. Integrated circuit devices 64, which include transistors, diodes, capacitors, resistors, and/or the like, are formed at a surface of substrate 68. In accordance with some embodiments of the present disclosure, substrate 68 is a semiconductor substrate, which may be a silicon substrate. Through-substrate Vias (TSVs, sometimes referred to as through-silicon vias) 66 extend to an intermediate level between a top surface and a bottom surface of substrate 68. TSVs 66 are conductive. In accordance with some embodiments, TSVs 66 extend into dielectric layer 70, which is over substrate 68. It is appreciated that there may be (or may not be) a plurality of dielectric layers between dielectric layer 70 and substrate 68, with metal lines and vias formed in the dielectric layers to connect to TSVs 66 and integrated circuit devices 64. Furthermore, the top surfaces of TSVs 66 may be level with the top surface of substrate 68, or maybe level with the top surface of any dielectric layer over substrate 68. In accordance with some embodiments, dielectric layer 70 is formed of a polymer or an inorganic material, similar to dielectric layer 32 in FIG. 17.

Figure 19:
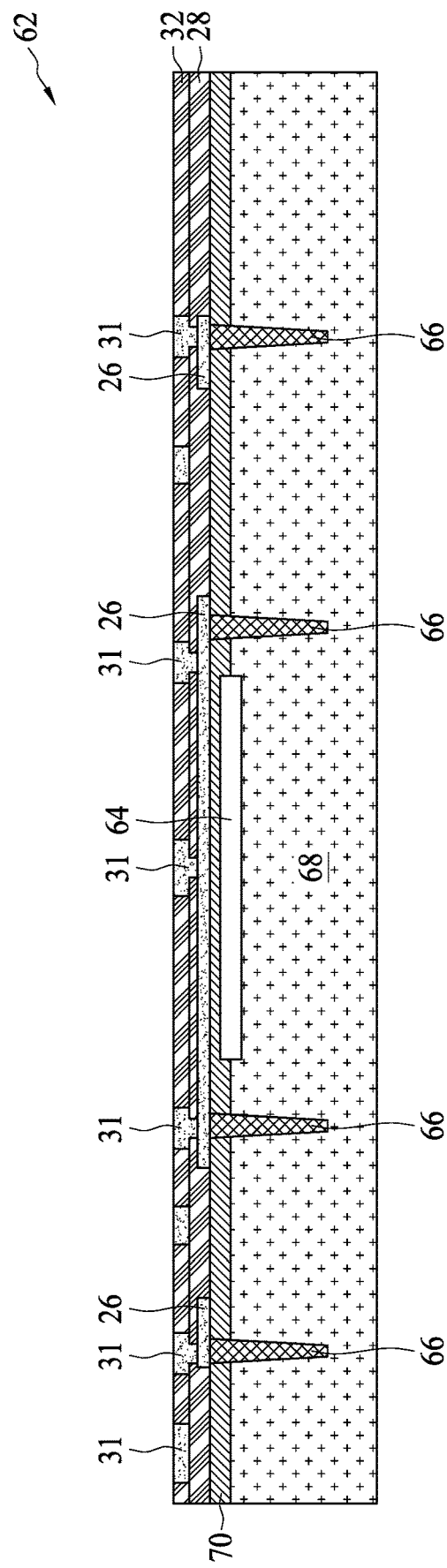

RDLs 26 are formed over dielectric layer 70, and are electrically coupled to TSVs 66. Next, as shown in FIG. 19, dielectric layer 28 is formed to cover RDLs 26. RDLs 31 and dielectric layer 32 are then formed. Bond pads 31 (which are parts of RDLs 31) are electrically coupled to TSVs 66 and integrated circuit devices 64.

Figure 20:
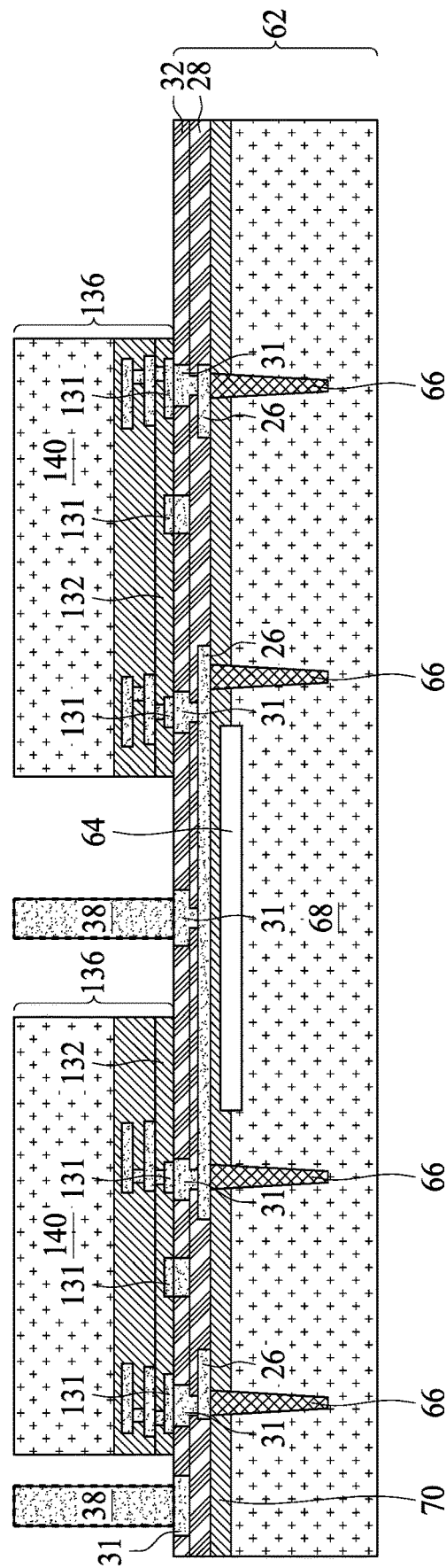
Figure 21:
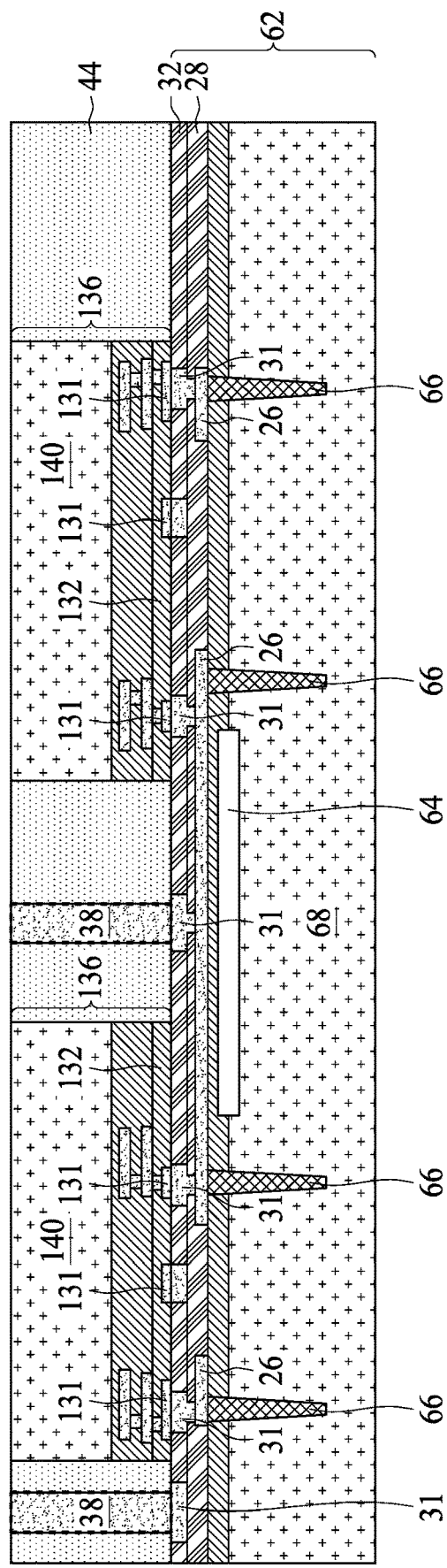

FIGS. 20 and 21 illustrate the formation of through-vias 38, the bonding of device dies 136 (FIG. 20), and the encapsulation of device dies 136 and through-vias 38 in encapsulating material 44 (FIG. 21). Similarly, through-vias 38 may be formed before or after the encapsulation of device dies 136. Next, a planarization step is performed to reveal through-vias 38 and substrates 140 of device dies 136. The step shown in FIGS. 11 through 16 may then be performed to form dielectric layers and RDLs over the structure shown in FIG. 22, and bond device dies 236 (FIG. 16). The overlying structure may be essentially the same as shown in FIG. 17.

Figure 22:
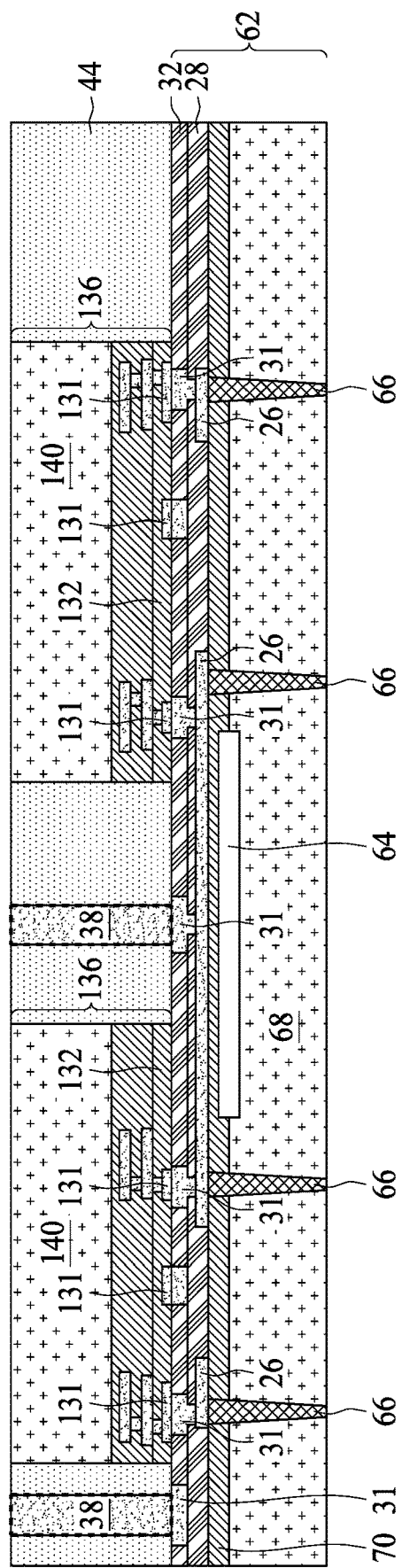
Figure 23:
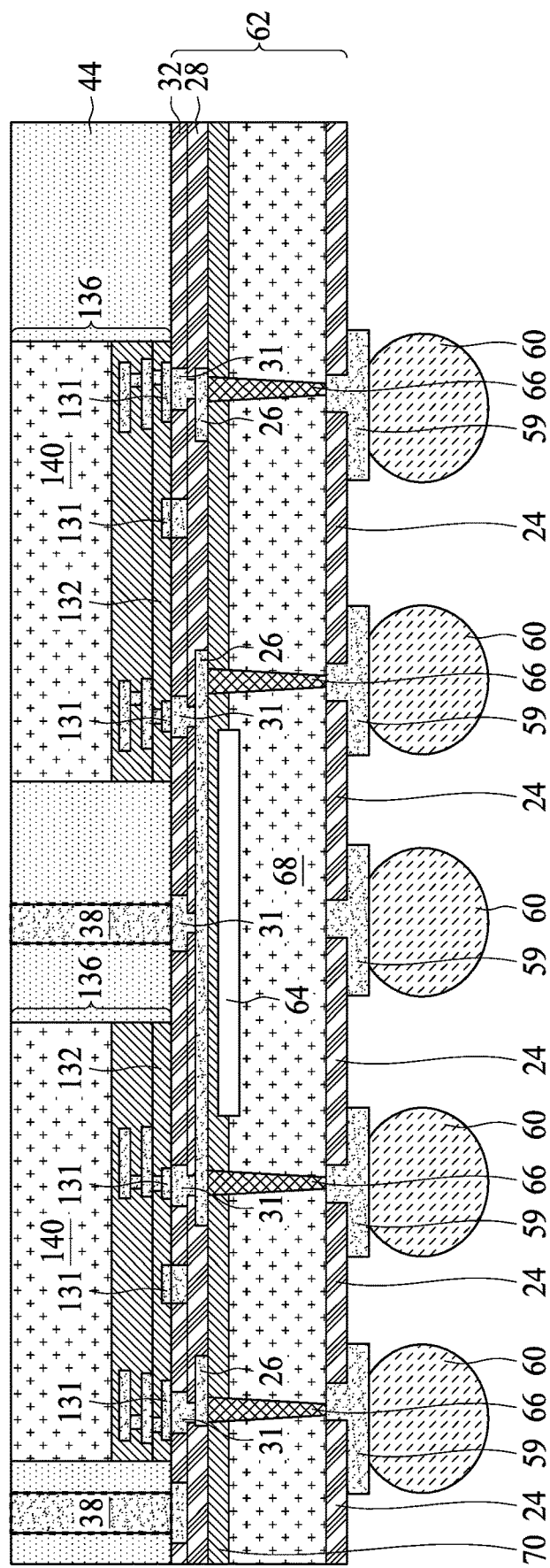

Referring to FIG. 22, a backside grinding is performed to remove the bottom portions of substrate 68, until TSVs 66 are revealed. Next, as shown in FIG. 23, dielectric layer 24, UBMs 59, and solder regions 60 are formed. Solder regions 60 are thus electrically coupled to RDLs 26 and through-vias 38 (if any). A singulation may be performed to separate wafer 62 and the overlying and underlying features into a plurality of packages that are identical to each other, and FIG. 23 illustrates one of the resulting packages.

Figure 24:
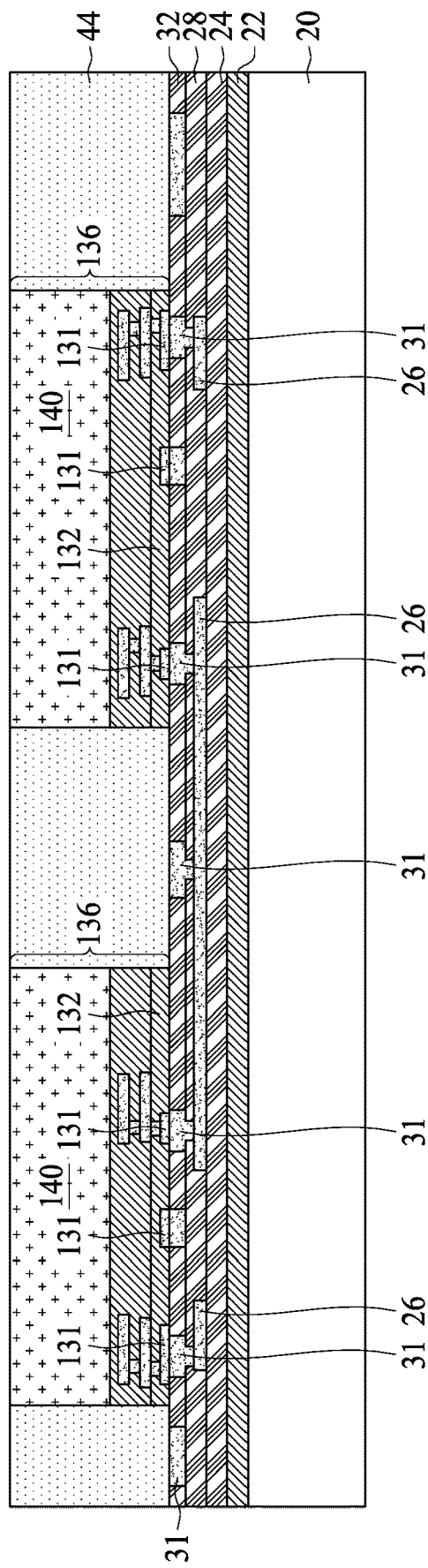
FIGS. 24 through 27 are cross-sectional views of intermediate stages in the manufacturing of a package in accordance with some embodiments.

FIGS. 24 through 27 illustrate the cross-sectional views of intermediate stages in the formation of a package in accordance with some embodiments. Referring to FIG. 24, an initial structure is formed. The initial structure is similar to what is shown in FIG. 9, wherein no through-vias are formed in encapsulating material 44.

Figure 25:
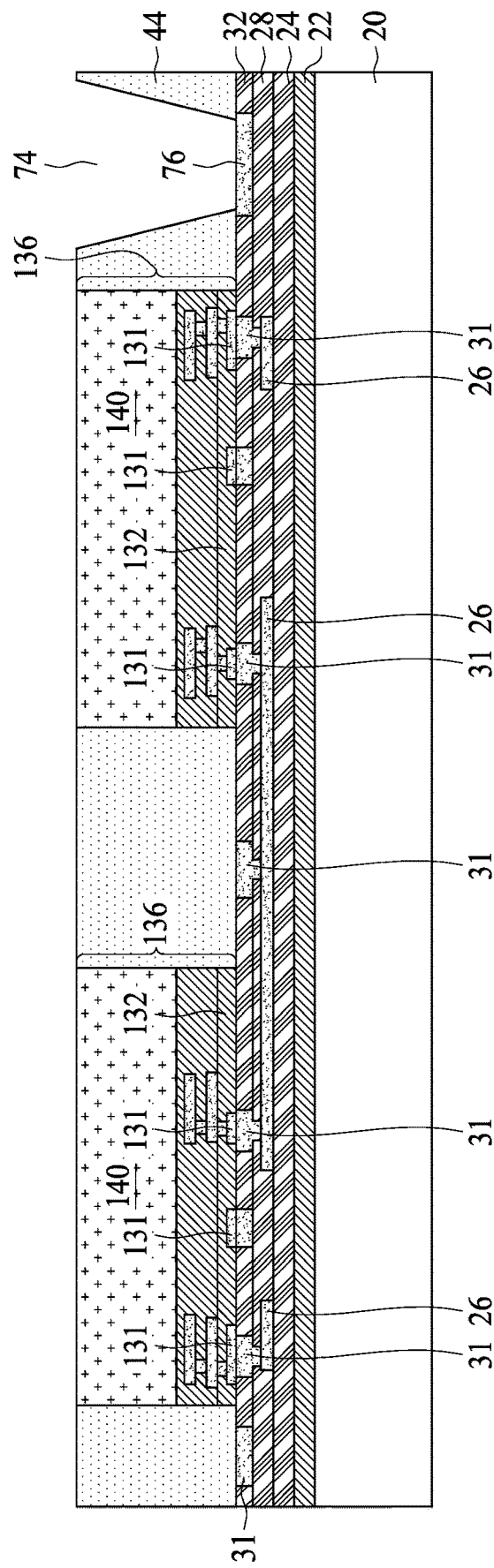
Figure 26:
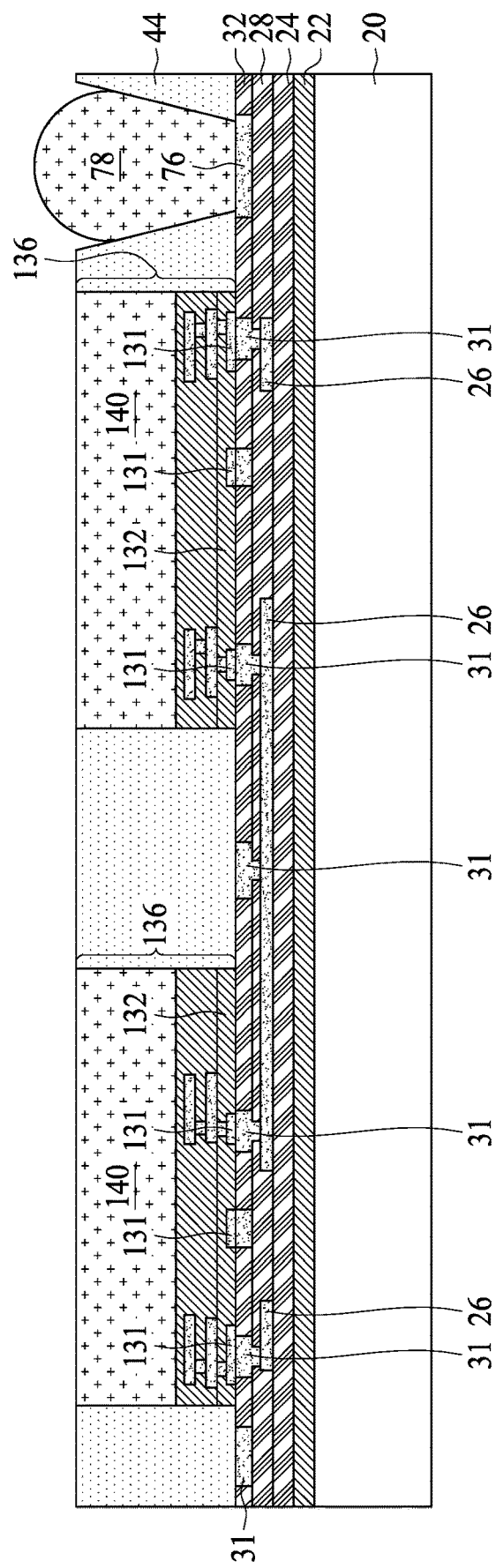
Figure 27:
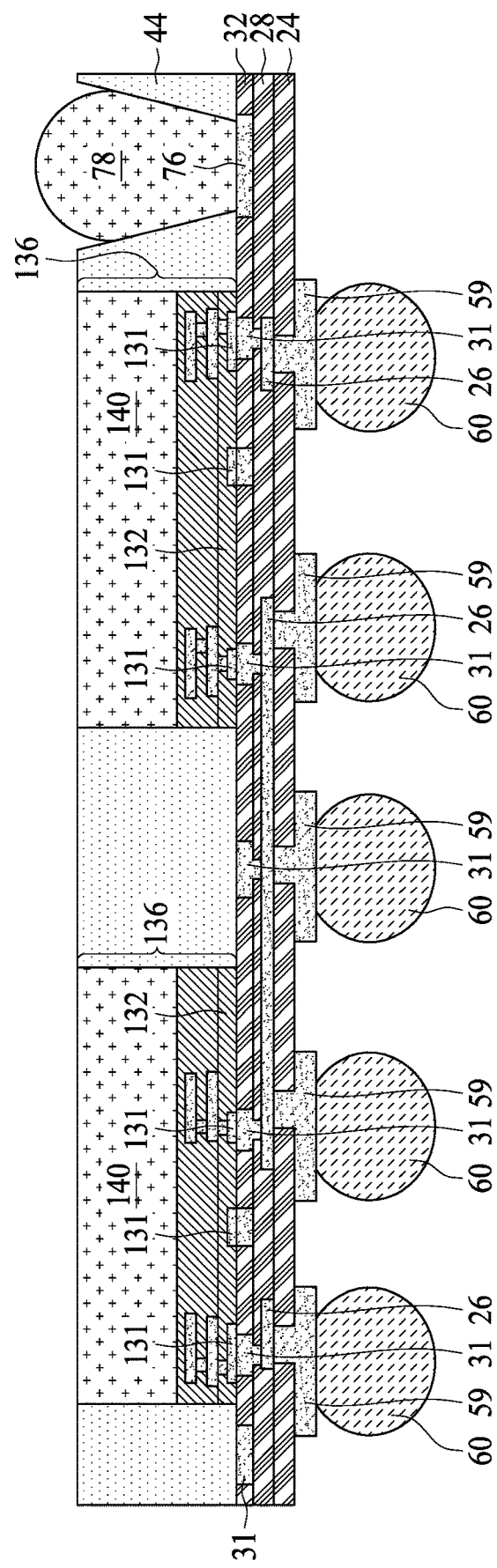

Next, as shown in FIG. 25, opening 74 is formed in encapsulating material 44 to reveal bond pad(s) 76, which is a part of RDLs 31. The formation of opening 74 may be achieved through laser drilling or etching, depending on the material of encapsulating material 44. FIG. 26 illustrates the formation of solder region 78 in opening 74, which may include placing a solder ball or plating a solder region into opening 74, and then performing a reflow on solder region 78. In subsequent steps, carrier 20 is de-mounted, and UBMs 59 and solder regions 60 are formed. The resulting structure is shown in FIG. 27. In subsequent steps, the respective package may be singulated, and solder region 78 may be used to bond to an overlying package component (not shown), which may be a device die or a package.

The embodiments of the present disclosure have some advantageous features. By forming RDLs (such as 26 and 31) prior to the bonding of device dies and the encapsulation of the device dies, the RDLs may be formed thinner with smaller spacing. As a comparison, if RDLs are formed after the encapsulation of device dies, since the co-planarity of the structure having the encapsulated device dies is worse than a glass carrier, the RDLs have to be wide, and the spacing between the RDLs have to be large, resulting in lower routing ability. In addition, the formation of RDLs involves some thermal processes, and hence forming it before the bonding of device dies advantageously reduces the thermal budget received by the device dies. In addition, by using hybrid bonding, no underfill is needed, and the thickness of the resulting package is reduced.

In accordance with some embodiments of the present disclosure, a method includes forming a dielectric layer over a carrier, forming a plurality of bond pads in the dielectric layer, and performing a planarization to level top surfaces of the dielectric layer and the plurality of bond pads with each other. A device die is bonded to the dielectric layer and portions of the plurality of bond pads through hybrid bonding. The device die is encapsulated in an encapsulating material. The carrier is then demounted from the device die and the dielectric layer.

In accordance with some embodiments of the present disclosure, a method includes forming a first dielectric layer over a carrier, forming a plurality of redistribution lines over the first dielectric layer, forming a second dielectric layer over the plurality of redistribution lines, and forming a plurality of bond pads in the second dielectric layer, with top surfaces of the plurality of bond pads substantially coplanar with a top surface of the second dielectric layer. A device die is bonded, wherein a surface dielectric layer of the device die is bonded to the second dielectric layer, and metal pads in the device die are bonded to the plurality of bond pads through metal-to-metal bonding. The device die is encapsulated in an encapsulating material. The carrier is demounted to reveal the first dielectric layer. Electrical connections are formed to penetrate through the first dielectric layer to electrically couple to the plurality of redistribution lines.

In accordance with some embodiments of the present disclosure, a package includes a plurality of redistribution lines having a first plurality of bond pads, and a first plurality of dielectric layers, with the plurality of redistribution lines located in the first plurality of dielectric layers. The first plurality of dielectric layers includes a first surface dielectric layer, with a first surface of the first surface dielectric layer being substantially coplanar with first surfaces of the first plurality of bond pads. A device die includes a second plurality bond pads bonded to the first plurality of bond pads through metal-to-metal bonding. A second plurality of dielectric layers includes a second surface dielectric layer, with the second surface dielectric layer having a second surface substantially coplanar with second surfaces of the second plurality bond pads. The first surface dielectric layer is bonded to the second surface dielectric layer through dielectric-to-dielectric bonds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a first carrier;
forming a conductive layer over the first carrier;
forming a plurality of metal bond pads over the conductive layer;
after forming the plurality of metal bond pads, forming a passivation layer over the conductive layer, the passivation layer surrounding the plurality of metal bond pads, wherein a first surface of the passivation layer is level with surfaces of the plurality of metal bond pads;
electrically coupling a plurality of electrode pads formed on an active surface of a semiconductor chip with the plurality of metal bond pads;
forming a molding compound over the first carrier and the plurality of metal bond pads;
removing the first carrier; and
forming a redistribution layer over the plurality of metal bond pads and a surface of the semiconductor chip opposite the active surface, the redistribution layer being electrically coupled to the plurality of metal bond pads.

2. The method of claim 1, wherein the molding compound encapsulates the semiconductor chip, wherein a first surface of the molding compound proximal the first carrier is coplanar with a first surface of the semiconductor chip.

3. The method of claim 2, further comprising grinding the molding compound so that a second surface of the molding compound distal the first carrier is coplanar with a second surface of the semiconductor chip.

4. The method of claim 2, further comprising mounting a second carrier to a second surface of the molding compound, the semiconductor chip being between the first surface of the molding compound and the second surface of the molding compound.

5. The method of claim 1, further comprising forming an electrical connector electrically coupled to the plurality of electrode pads through the plurality of metal bond pads, wherein the molding compound is formed encapsulating the electrical connector.

6. The method of claim 1, further comprising forming a dielectric layer on the conductive layer after forming the conductive layer and prior to forming the plurality of metal bond pads.

7. A method comprising:
forming a conductive layer;

forming a plurality of metal bond pads over the conductive layer, wherein surfaces of the metal bond pads opposite the conductive layer are coplanar with one another;

after forming the plurality of metal bond pads, forming a passivation layer over the conductive layer, the passivation layer surrounding the plurality of metal bond pads;

attaching a first semiconductor chip and a second semiconductor chip to the plurality of metal bond pads, wherein a first plurality of electrode pads formed on an active surface of the first semiconductor chip are electrically coupled to the plurality of metal bond pads;

forming an electrical connector electrically coupled to the plurality of metal bond pads;

forming a molding compound over the passivation layer and the plurality of metal bond pads, the molding compound encapsulating the first semiconductor chip, the second semiconductor chip, and the electrical connector, wherein a surface of the molding compound is level with surfaces of the first plurality of electrode pads; and forming a redistribution layer over the plurality of metal bond pads and a surface of the first semiconductor chip opposite the active surface, the redistribution layer being electrically coupled to the plurality of metal bond pads through the electrical connector.

8. The method of claim 7, further comprising forming a second electrical connector electrically coupled to a second plurality of electrode pads of the second semiconductor chip, wherein the molding compound is formed encapsulating the first semiconductor chip, the electrical connector, the second semiconductor chip, and the second electrical connector.

9. The method of claim 7, further comprising forming a dielectric layer over a first carrier, wherein the metal bond pads and the passivation layer are formed over the dielectric layer.

10. The method of claim 9, further comprising forming the conductive layer in the dielectric layer, the conductive layer having surfaces coplanar with each other, the conductive layer being electrically coupled to the metal bond pads.

11. The method of claim 10, further comprising:
removing the first carrier; and
forming a plurality of solder balls over the conductive layer, the plurality of solder balls being electrically coupled to the conductive layer.

12. The method of claim 7, further comprising forming a dielectric layer on the conductive layer, wherein the dielectric layer is in direct contact with a top surface of the conductive layer, and wherein the dielectric layer is in direct contact with bottom surfaces of the plurality of metal bond pads.

13. A method comprising:
forming a plurality of bond pads over a carrier;
after forming the plurality of bond pads, forming a first dielectric layer surrounding the plurality of bond pads;
electrically coupling a first semiconductor chip to the plurality of bond pads, wherein the first semiconductor chip has an active surface and a plurality of electrode pads formed on the active surface, and wherein the plurality of electrode pads are electrically coupled to the plurality of bond pads;
forming a molding compound over the first semiconductor chip and the plurality of bond pads, wherein the molding compound has a surface coplanar with bottom surfaces of the plurality of electrode pads;
removing the carrier; and
forming a redistribution layer on the molding compound, the redistribution layer being electrically coupled to the plurality of bond pads.

14. The method of claim 13, further comprising forming a conductive layer and a second dielectric layer surrounding the conductive layer over the carrier, wherein the plurality of bond pads and the first dielectric layer are formed over the conductive layer and the second dielectric layer.

15. The method of claim 13, wherein forming the molding compound comprises using an underfill material.

16. The method of claim 13, further comprising electrically coupling a second semiconductor chip to the plurality of bond pads, wherein the second semiconductor chip are electrically coupled to the plurality of bond pads, and wherein the molding compound encapsulates the second semiconductor chip.

17. The method of claim 13, further comprising forming one or more vias connecting one or more of the plurality of bond pads to the redistribution layer.

18. The method of claim 13, wherein the redistribution layer is formed on a surface of the first semiconductor chip opposite the active surface.

19. The method of claim 13, further comprising forming a plurality of solder balls electrically coupled to the plurality of bond pads.

20. The method of claim 17, wherein the one or more vias are formed before forming the molding compound.

* * * * *